(12) United States Patent
Wytman

(10) Patent No.: US 6,764,713 B2
(45) Date of Patent: Jul. 20, 2004

(54) METHOD OF PROCESSING A WAFER USING A COMPLIANT WAFER CHUCK

(75) Inventor: Joseph Wytman, San Jose, CA (US)

(73) Assignee: Mattson Technology, Inc., Fremont, CA (US)

( * ) Notice: Subject to any disclaimer, the term of this patent is extended or adjusted under 35 U.S.C. 154(b) by 293 days.

(21) Appl. No.: 09/825,648

(22) Filed: Apr. 4, 2001

(65) Prior Publication Data

US 2001/0011637 A1 Aug. 9, 2001

Related U.S. Application Data

(62) Division of application No. 09/293,012, filed on Apr. 16, 1999, now Pat. No. 6,241,825.

(51) Int. Cl.[7] .............................. B05D 1/00; B05D 5/00; B23H 1/00; C25D 3/38
(52) U.S. Cl. ........................ 427/123; 427/58; 205/122; 205/640; 438/584; 438/674; 438/687; 438/689; 414/779
(58) Field of Search .................................. 205/118, 122, 205/123, 125, 295, 640; 204/297.01, 297.06, 297.07, 297.1; 427/58, 123; 438/584, 674, 687, 689; 414/779

(56) References Cited

U.S. PATENT DOCUMENTS

| 3,826,558 | A |   | 7/1974  | Rasberry et al.     |
|-----------|---|---|---------|---------------------|
| 4,086,870 | A |   | 5/1978  | Canavello et al.    |
| 5,000,827 | A |   | 3/1991  | Schuster et al.     |
| 5,024,746 | A |   | 6/1991  | Stierman et al.     |
| 5,095,848 | A |   | 3/1992  | Ikeno               |
| 5,256,274 | A |   | 10/1993 | Poris               |
| 5,368,711 | A |   | 11/1994 | Poris               |
| 5,429,733 | A |   | 7/1995  | Ishida              |
| 5,437,777 | A |   | 8/1995  | Kishi               |
| 5,441,629 | A |   | 8/1995  | Kosaki              |
| 5,447,615 | A |   | 9/1995  | Ishida              |
| 5,516,414 | A |   | 5/1996  | Glafenhein et al.   |
| 5,830,805 | A |   | 11/1998 | Shacham-Diamand et al. |
| 5,853,559 | A | * | 12/1998 | Tamaki et al. ............... 205/157 |
| 5,885,353 | A |   | 3/1999  | Strodbeck et al.    |
| 5,891,251 | A |   | 4/1999  | MacLeish et al.     |
| 6,019,164 | A | * | 2/2000  | Getchel et al. ............ 165/80.1 |

FOREIGN PATENT DOCUMENTS

JP          2628886          7/1997

OTHER PUBLICATIONS

Contolini, R., et al., A Coper Via Plug Process by Electrochemical Planarization, 1993 VMIC Conference—102/93/0470, Jun. 8–9, 1993, pp. 470–477.

Pai, Pei–Lin & Ting, Chiu, Copper as the Future Interconnection Material, 1989 VMIC Conference, TH–0259–2/89/0000–0258, Jun. 12–13, 1989, pp. 258–264.

(List continued on next page.)

Primary Examiner—Nam Nguyen
Assistant Examiner—Brian L Mutschler
(74) Attorney, Agent, or Firm—Blakely Sokoloff Taylor & Zafman LLP

(57) ABSTRACT

A method of processing a wafer includes placing a wafer atop a wafer chuck, wherein the chuck has a base and an upper body in which the upper body is coupled to the base by a flexible coupling that allows the upper body to tilt relative to the base. The wafer is engaged to a hollow sleeve and forms a floor creating an enclosed vessel to retain a processing fluid. Once the vessel is filled, the wafer is then processed utilizing the processing fluid. Further, the wafer tilts allowing for a compliant engagement of the wafer and the sleeve to prevent or reduce leakage of the processing fluid.

4 Claims, 9 Drawing Sheets

OTHER PUBLICATIONS

Contolini, R., et al., Copper Electroplating Process for Sub–Half–Micron ULSI Structures, 1995 VMIC Conference—104/95/0322, Jun. 27–29, 1995, pp. 322–328.

Ting, Chiu H., et al., Recent Advances in Cu Metallization, 1996 VMIC Conference, 106/96/0481(c), Jun. 18–20, 1996, pp. 481–486.

Contolini, Robert J., et al., Electrochemical Planarization for Multilevel Metallization, J. Electrochem. Soc., vol. 141, No. 9, Sep. 1994, pp. 2503–2510.

EQUINOX—Single Substrate Processing System, A SEMITOOL Brochure, EQU025–4/94, pp. 1.8–8.8.

* cited by examiner

METHOD OF PROCESSING A WAFER USING A COMPLIANT WAFER CHUCK

CROSS-REFERENCE TO RELATED APPLICATION

This application is a divisional of application Ser. No. 09/293,012, filed Apr. 16, 1999, now U.S. Pat. No. 6,241,825 and claims priority from that filing date.

BACKGROUND OF THE INVENTION

1. Field of the Invention

The present invention relates to the field of semiconductor wafer processing and, more particularly, to a compliant chuck for supporting a wafer in a processing chamber.

2. Background of the Related Art

Various processing chambers are known in the art for processing semiconductor wafers, such as silicon wafers. Present practices include the manufacture of integrated circuit devices on the wafer by fabricating multiple levels of conductive (typically metal) layers above a substrate of the wafer. The multiple metallization layers are employed in order to accommodate higher densities as device dimensions shrink. Likewise, the size of interconnect structures also need to shrink in order to accommodate the smaller dimensions. The various processing chambers are utilized to deposit or remove materials in order to fabricate the integrated circuits. For example, deposition techniques include processes such as physical vapor deposition (PVD), chemical vapor deposition (CVD), sputtering, and immersion of the wafer in an electrolyte. Similarly, a number of techniques are known for removing a material from a wafer. These techniques include reactive ion etching (RIE), plasma etching, chemical-mechanical polishing (CMP), and immersion of the wafer in an electrolyte.

Typically, the practice involves the complete placement of a wafer or wafers in the processing chamber. In single wafer processing, the wafer is typically placed on a chuck, which resides or is made to reside within the confines of the chamber. The chuck may be rotated to rotate the wafer. The chucks provide a hard upper surface upon which the wafer resides. The chuck is positioned so that all of the wafer resides within the interior walls of the processing chamber.

However, another line of processing chambers utilize the wafer to form the floor of the containment area for the processing fluid. For example, in a processing chamber described in U.S. patent application entitled "Process chamber and Method for Depositing and/or Removing Material on a Substrate;" Ser. No. 08/916,564; filed Aug. 22, 1997; and assigned to the assignee of this application, a processing surface of the wafer forms the floor of the inner containment chamber, which holds the processing fluid for processing the exposed wafer surface. Another example of a processing chamber in which the wafer forms the floor of the containment vessel is described in U.S. patent application entitled "Method and Apparatus for the Disposal of Processing Fluid Used to Deposit and/or Remove Material on a Substrate;" Ser. No. 09/118,362; filed Jul. 17, 1998; and also assigned to the assignee of this application.

In both examples, the processing fluid is an electrolyte for processing the wafer. The electrolyte is retained in the confined area bounded by the sidewalls and the wafer, which wafer forms the base or floor of the confined area. In order to achieve this confinement, the sidewalls (at least a portion of it) mate to the periphery (edge) of the wafer. Generally, once the wafer is placed upon a chuck, the chuck and the wafer are raised until the wafer edges mate to the bottom surface of the sidewalls of the containment vessel. A seal, such as an O-ring, is typically required to hold the fluid within the vessel and/or to protect electrodes, where electrodes are mated to the outer edge of the wafer.

In practice, the sidewall bottom surface contacting the wafer should be minimized to a narrow region at the edge of the wafer. Since this region of the wafer would not be processed for fabricating the integrated circuit devices, chip manufacturers typically want to limit the non-processing area as small as possible. Minimizing the edge waste area, requires a thin (or narrow) O-ring to contact the edge of the wafer to form a seal. However, thin O-rings are more susceptible to leakage and less fluid pressure can be applied on them.

In order to maintain tight seal integrity around the circumference of the wafer's edge where the sidewall joins the wafer surface, the mating boundary between the sidewall and the wafer's surface cannot exceed a given tolerance. Yet, due to misalignment, tolerance imperfections, pressure changes within the vessel, O-ring wear, as well as for other reasons, it is difficult to maintain tight seal integrity at the boundary. This is further complicated when a thin O-ring is used. Maintaining this degree of tolerance is difficult, if not impossible, to achieve using thin O-rings. The direct impingement of the processing fluid on the O-ring often causes the O-ring to deteriorate. Also, with thinner O-rings the seal integrity breakdown can occur at much lower pressure. The leakage of the fluid can adversely affect the performance of the system, since the fluid can contact the backside of the wafer itself and/or the electrodes contacting the edge of the wafer (if such electrodes are present).

These problems are caused by the difficulty in properly sealing the containment sleeve on to the wafer's surface. The problem is amplified when larger diameter wafers are being processed, since the contact area is over a larger circumference. Since the wafer is residing on a flat rigid surface of the chuck, the wafer is not flexible to adjust to any gap separation distance which exceeds the tolerance. Improper alignment of the wafer and/or the chuck can also cause a gap separation to widen.

Accordingly, what is needed is a scheme in which unwanted sidewall-wafer gap separation is reduced or prevented when semiconductor wafers are processed in a processing chamber, especially where the wafer forms the floor of the containment region.

SUMMARY OF THE INVENTION

A compliant wafer chuck for supporting a substrate. The chuck is comprised of a base having a rigid frame for forming a lower portion of a chuck and an upper body residing atop the base for having the substrate reside on its surface. The upper body is coupled flexibly to the base to allow the upper body to tilt relative to the base.

DETAILED DESCRIPTION OF THE INVENTION

A compliant chuck (also referred to as a wafer support, platen, or platform) for use with a processing chamber is described. In the following description, numerous specific details are set forth, such as specific structures, materials, processes, etc., in order to provide a thorough understanding of the present invention. However, it will be appreciated by one skilled in the art that the present invention may be practiced without these specific details. In other instances, well-known techniques and structures have not been described in detail in order not to obscure the present invention.

Figure 1:
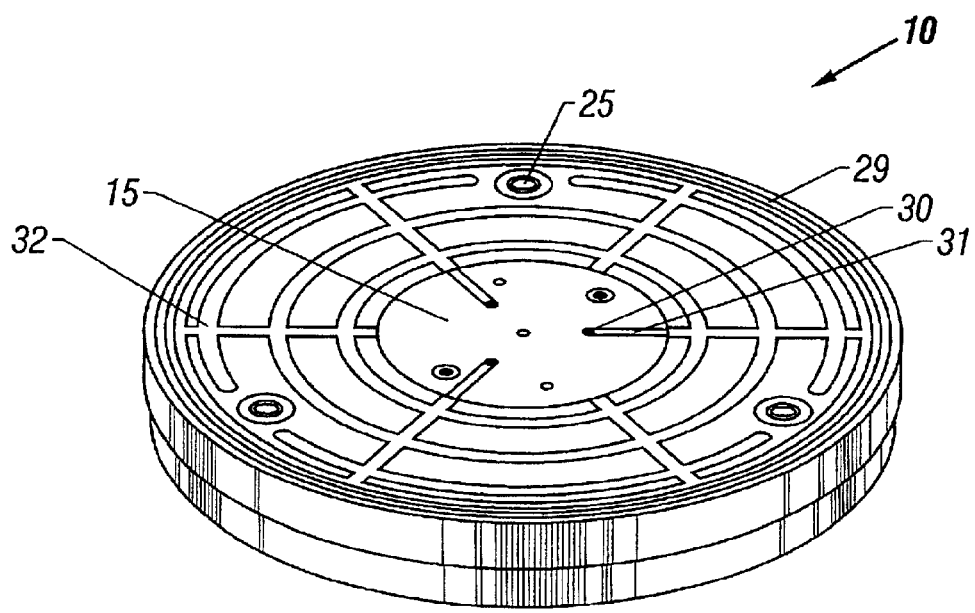
FIG. 1 is a pictorial illustration of the compliant wafer chuck of the present invention.
Figure 2:
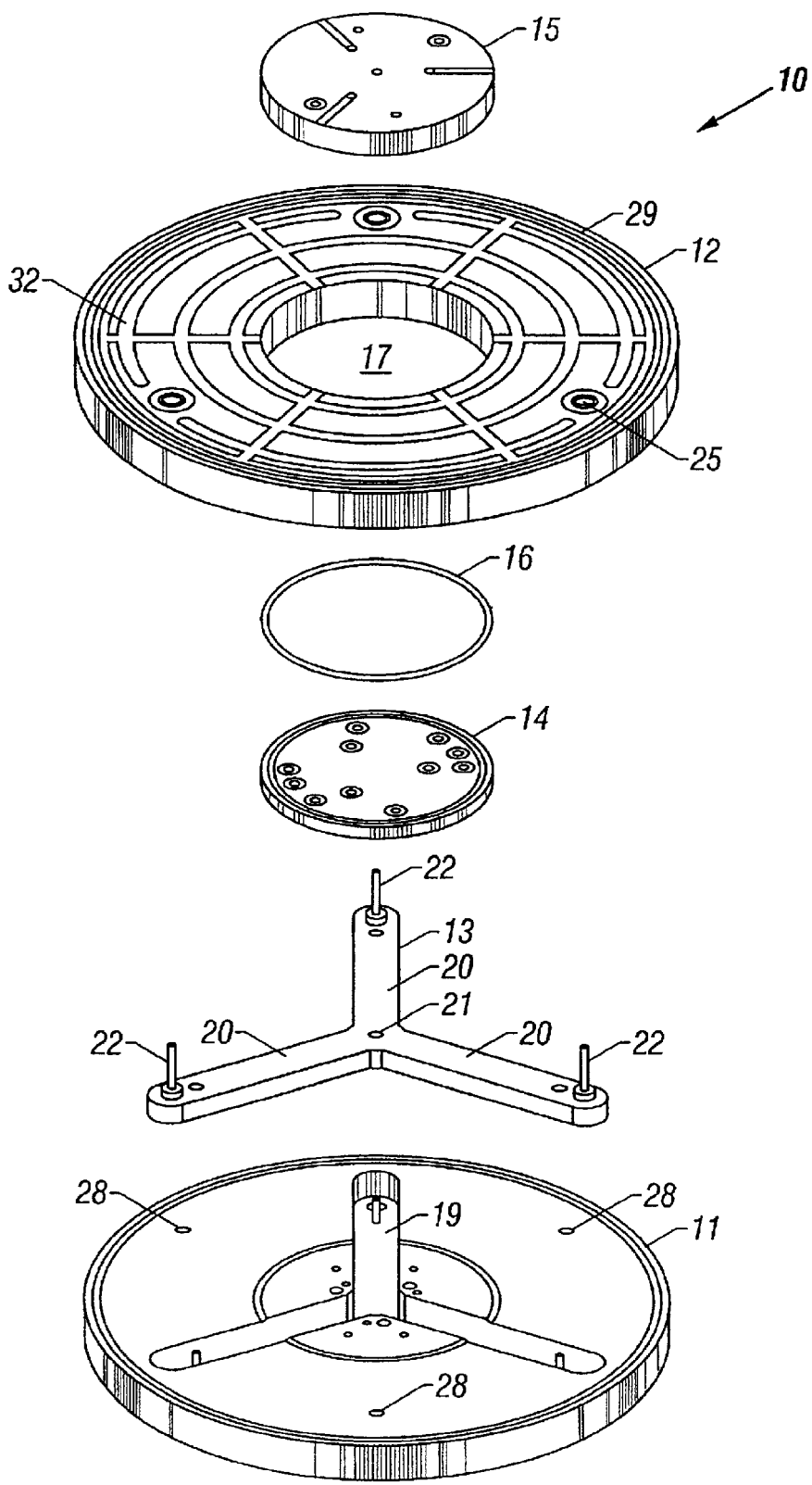
FIG. 2 is an exploded view of the wafer chuck of FIG. 1.

Referring to FIG. 1, a compliant wafer chuck 10 of the preferred embodiment of the invention is illustrated. An exploded view of the chuck 10 is shown in FIG. 2. The wafer chuck 10 is comprised of a chuck base 11, chuck body 12, spider chuck 13, bottom disk 14, top disk 15 and a flexible coupling 16. It is appreciated that only the main components of the chuck 10 are shown. Nuts, bolts, screws, fittings, etc. which are required to assemble the chuck 10, are not shown in detail in FIG. 2, in order not to clutter the illustration.

When the various components 11–16 are assembled together, they form a circular assembly which is substantially planar at both the top and bottom surfaces. The chuck base 11 is a rigid circular plate for forming the base (or lower portion) of the wafer chuck 10. The underside of the chuck base 11 is coupled to a shaft (also referred to as a spindle or mandrel), which supports the wafer chuck 10 in place. Openings or holes through the chuck base 11 allow fastening means (screws, bolts, etc.) to be used to mount the chuck base 11 onto the shaft. Openings are also present for passage of fluid, such as air or inert gas, or for providing vacuum. On the upper surface of the base 11 is an indentation 19, which is formed in the shape of the spider chuck 13. When assembled, the spider chuck 13 is made to reside within the indentation 19.

The spider chuck 13 is shown as a tri-finger device wherein each finger 20 emanates from a central hub 21 and positioned 120 degrees apart. A lift pin 22 is located at the end of each finger 20. The tri-finger spider chuck 13 is positioned to reside within the indentation 19 of the base 10 with the lift pins facing upward, away from the base 11. It is appreciated that the spider chuck 13 may have any number of fingers (including a design where there is only one lift pin), but the 120 degree configuration using the three lift pins provide a stable mechanism for lifting the wafer. Furthermore, a central pin at the hub 21 aligns the spider chuck 13 to the base 11 so that the spider chuck 13 is retained in place horizontally, but can slide vertically relative to the base 11.

Once the spider chuck 13 is positioned within the indentation 19, the bottom disk 14 is positioned centrally atop both units 11, 13. The diameter of the disk 14 is smaller than the chuck base 11 or the chuck body 12. The diameter of disk 14 is sized so that it will reside within a central opening 17 present on the chuck body 12. Openings are also present on the bottom disk 14 for mounting the disk onto the base 11. Corresponding fluid and vacuum openings are present as well to align with fluid and vacuum openings present on the base 11. Since the bottom disk 14 resides atop the indentation, it prevents the spider chuck 13 from lifting out of the indentation 19 when assembled. However, the spider chuck 13 is free to slide in a vertical direction within the indentation 19.

Next, a flexible coupling 16, in a form of an elastomer, is placed along the outer periphery of the bottom disk 14. In the preferred embodiment, this elastomer is a rubber O-ring which fits tightly around the periphery of the disk 14. In the preferred design, a stepped groove is present for accepting the flexible coupling 16.

Subsequently, the top disk 15 is positioned to mate to the lower disk 14. The position of the flexible coupling 16 is such that it also contacts the periphery of the upper disk 15. Corresponding openings are also present on the disk 15. Screws, bolts, etc. are used to mount both of the disks 14, 15 to the base 11. When so mounted, the base 11, disk 14 and disk 15 are rigidly fixed together so that they will not move separately when mounted to the shaft.

Then, the chuck body 12 is positioned atop the chuck base and the central opening 17 accommodates the two disks 14, 15, so that the upper surface of the body 12 is substantially planar with the upper surface of the disk 15. Furthermore, three openings 25, spaced 120 degrees apart, are aligned to the lift pins 22 of the spider chuck 13, so that when the spider chuck 13 is raised, the lift pins extend through the openings 25.

Figure 3:
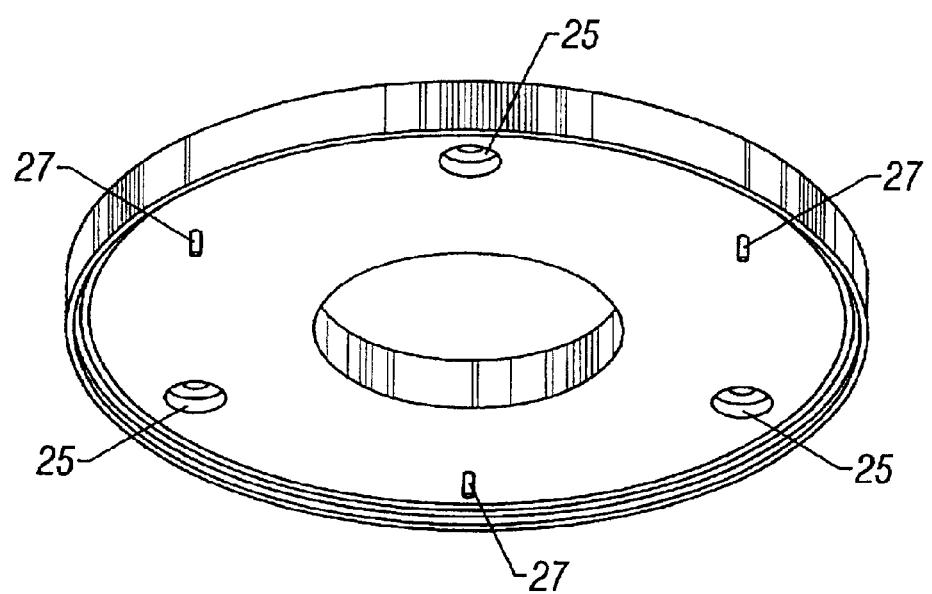
FIG. 3 is a pictorial illustration of the underside of the chuck body of the wafer chuck.

It is appreciated that the chuck body 12 is not affixed to the other units. Rather, dowels 27 disposed along the underside of the chuck body 12, which are detailed in FIG. 3, fit into corresponding openings 28 present on the base 11. The flexible coupling 16 provides a snug fit of the chuck body 12 to the two disks 14, 15. Thus, the chuck body 12 resides atop the base 11 without being affixed in a permanent fashion to the other units. A snug fit is provided by the flexible coupling 16, where the wall of the chuck body 12 at the central opening 17 mates to the sides of the two disks 14, 15. This placement of the chuck body 12 allows the body to tilt relative to the other units, but vertical alignment of the chuck body 12 to the base 11 is maintained by the dowels 27.

As will be described below, the tilting of the chuck body 12 relative to the chuck base 11 allows the edges of the wafer chuck to tilt slightly, but the center of the chuck is maintained stationary. When a wafer is positioned atop the chuck 10, the center of the wafer is positioned atop the upper disk 15, while the periphery of the wafer resides beyond the outer edge of the chuck 10. A gasket or O-ring 29 is disposed at the outer edge along the upper surface of the chuck body 12 to allow the wafer to reside thereon and also to seal the underside of the wafer.

In the preferred embodiment, multiple low pressure or vacuum openings 30 are present along the surface of the top disk 15 for applying vacuum to the underside of the wafer to hold it in place (see FIG. 1). Furthermore, grooves 31 emanate from the openings 30 and mate to a series of grooves 32 present on the surface of the chuck body 12, so that vacuum can be extended to the surface of the body also for holding the wafer in place. Accordingly, once the wafer is placed atop the chuck 10 and vacuum applied, the wafer is held in place, but the edges of the wafer are able to tilt relative to the fixed plane of the chuck determined by the two central disks 14, 15.

Figure 4:
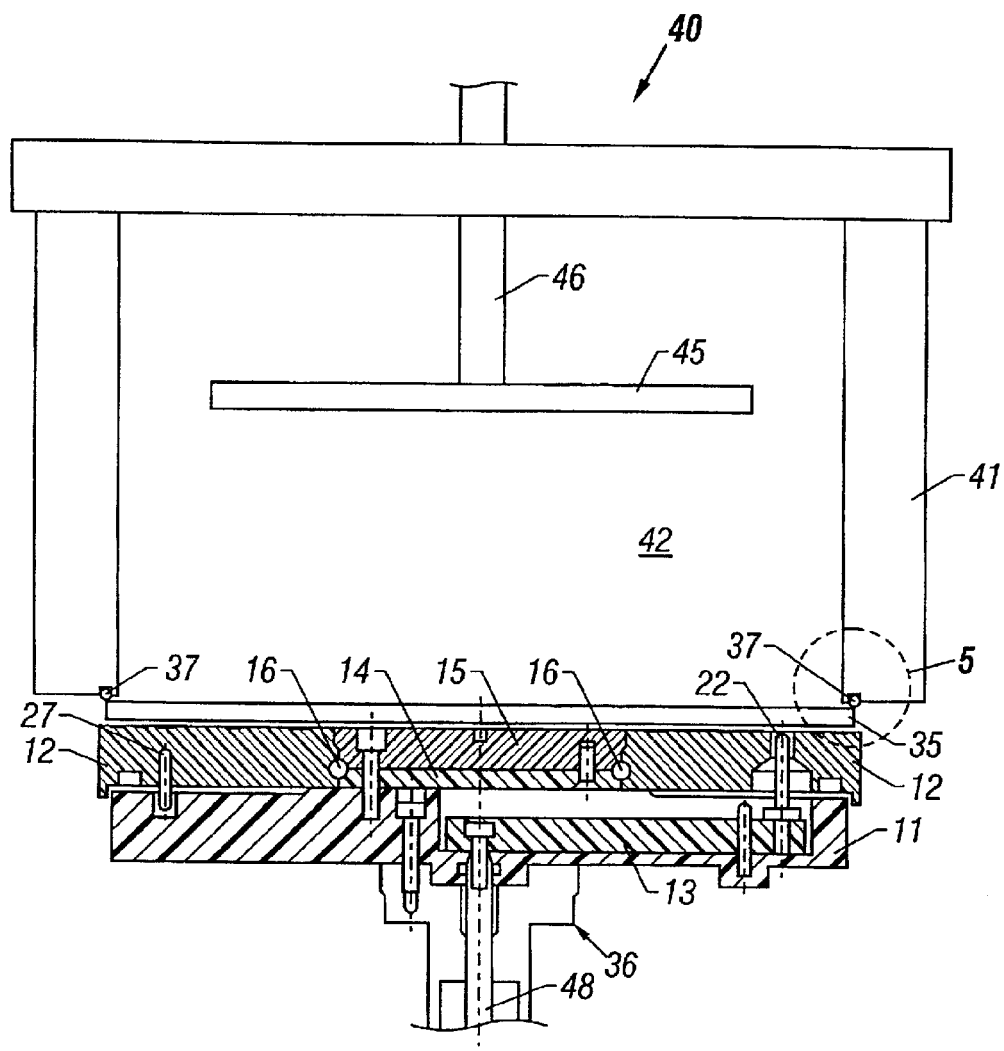
FIG. 4 is a cross-sectional view of the compliant chuck of FIG. 1 when placed into a processing position within a chamber, in which the wafer forms the floor of the containment vessel holding a processing fluid.

A cross-section of the assembled wafer chuck 10 of FIGS. 1 and 2 is shown in FIG. 4. FIG. 4 shows the complete assembly of the components described above with a wafer 35 positioned atop the chuck 10. As noted, the spider chuck 13 is in the normal or resting position at the bottom of the base 11. The chuck base 11 is affixed onto a shaft 36. The bottom and top disks 14, 15 are then affixed to the base 11. When the chuck body 12 is positioned in place and aligned properly, the dowels 27 fit into the openings 28 and lift pins 22 reside under openings 25. The flexible coupling 16, in the form of an O-ring, allows for a snug fit of the body 12 to the central disks 14, 15. However, since the chuck body is not affixed, the body 12 is allowed to move vertically and allowed to tilt relative to the chuck center.

As shown in FIG. 4, the edge of the wafer extends to the outer rim (or edge) of the wafer chuck 10, but not beyond. However, it is appreciated that the wafer edge could extend beyond the rim of the chuck. FIG. 4 shows the placement of the wafer 35 in the processing position. Although the wafer chuck 10 can be utilized in a variety of processing chambers, the preferred technique is to use the chuck 10 in a chamber where the wafer functions as the floor of the containment vessel. Accordingly, a processing chamber 40 is shown having a sleeve 41, which functions as the sidewall for the containment vessel (or region) 42 for retaining a processing fluid. When the sleeve 41 engages the wafer 35, the wafer 35 forms the floor of the containment vessel 42.

Generally, in operation, the wafer 35 is loaded onto the chuck 10 when the chuck 10 is disengaged from the sleeve 41. That is, the shaft is lowered to a wafer load position. The wafer 35 is loaded and then the shaft is raised to engage the wafer 35 to the bottom surface of the sleeve 41. A gasket, O-ring or some other elastomer is used as a seal 37 at this junction to seal in the processing fluid. The processing fluid is then introduced in the chamber to process the wafer 35.

An example of a processing chamber that may be used with the present invention is described in detail in U.S. patent application entitled "Process Chamber and Method for Depositing and/or Removing Material on a Substrate;" Ser. No. 08/916,564; filed Aug. 22, 1997. Another example of a processing chamber that may be used with the present invention is described in detail in U.S. patent application entitled "Method and Apparatus for the Disposal of Processing Fluid Used to Deposit and/or Remove Material on a Substrate;" Ser. No. 09/118,362; filed Jul. 17, 1998. Both applications are assigned to the Assignee of this application.

It is appreciated that the chamber 40 can be utilized for holding a variety of processing fluids. However, the chamber of the preferred embodiment utilizes a liquid electrolyte for electroplating (depositing) or electropolishing (removing) metal, including copper material, onto/from the wafer 35. The technique of electroplating and electropolishing materials, such as copper, are known in the art and the above-mentioned applications also describe techniques for performing such processing. Accordingly, for electroplating, an anode electrode 45 is disposed on an anode shaft 46 and located within the containment vessel 42. Cathode electrodes 47 are dispersed along the periphery of the wafer 35 so as not to contact the processing fluid. An enlargement of the wafer edge and the cathode region is detailed in FIG. 5.

Figure 5:
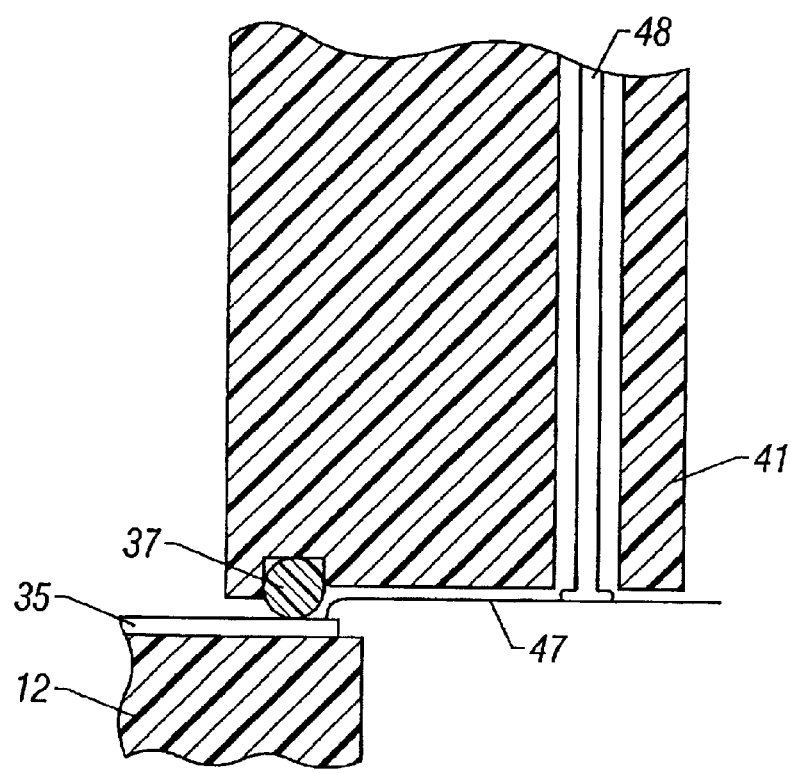
FIG. 5 is an enlarged cross-sectional view showing a portion of the wafer engaging a sleeve to form the containment vessel.

As shown in FIG. 5, the sleeve 41 engages the edge of the wafer 35 and the seal 37 prevents fluid leakage at the bottom of the containment vessel. A conductor 48 extends vertically through the sleeve wall to provide an electrical contact to the cathode electrode 47. The end of the cathode electrode 47 contacts the edge of the wafer on the protected side of the seal 37. A number of such cathodes 47 are distributed around the circumference of the wafer edge to provide multiple cathode contacts to the wafer. Accordingly, when electroplating, electrolyte is introduced and a voltage potential applied across the anode and the cathode(s), and the electroplating of metal, such as copper, is achieved.

For electropolishing, the anode and cathode(s) are reversed so that electrode 45 operates as the cathode and electrode(s) 47 operate as the anode(s). Electropolishing electrolyte is introduced as the processing fluid to remove metal, such as copper, from the wafer surface. It is appreciated that the wafer chuck 10 of the present invention can be utilized in a variety of chambers and need not be limited to the electroplating and/or electropolishing of metal materials. Furthermore, the wafer processing fluid need not be limited to processing liquids and can be a gas or plasma.

Figure 6:
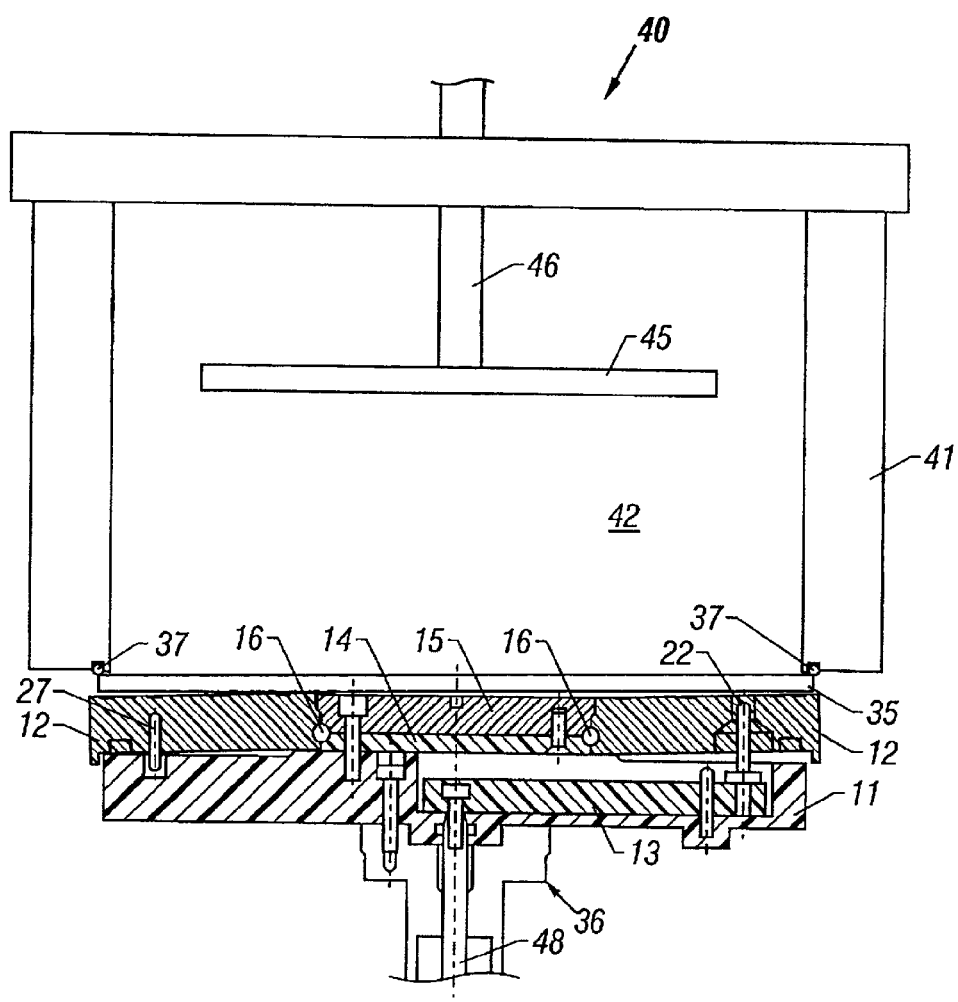
FIG. 6 is a cross-sectional view of the compliant chuck of FIG. 4 and illustrating the operation of the compliant nature of the chuck in tilting the wafer to maintain proper engagement of the wafer to the sleeve.

Referring to FIG. 6, a compliant nature of the wafer chuck 10 of the preferred embodiment is illustrated. The chamber 40 is the same chamber as shown in FIG. 4, but now the sleeve 41 at the right side of the drawing is slightly less in height than the left side of the drawing. If a prior art chuck, having a rigid chuck configuration, had been utilized, a gap separation at the short side of the sleeve would have been larger than at the opposite side. If the gap separation exceeded the tolerance, leakage would have occurred. Appreciable tolerance variations can occur at a particular region of the rim of the wafer during use after the chuck 10 and the sleeve 41 are initially aligned. Typically, manual adjustment (which requires time to perform) or replacement of components (which also requires time to perform) would be required to correct the problem. Accordingly, prior art chucks require precise tolerances at the wafer-sleeve interface so that when the sleeve engages the wafer, substantial gaps are not present. This precise tolerance is difficult to maintain over time.

The wafer chuck 10 of the present invention performs the tolerance adjustment automatically. As shown in FIG. 6, if there is a tolerance variation at one location, the chuck body 12 is able to tilt to compensate for the excessive gap. Thus in the example, where the sleeve portion at the left extends slightly lower than the sleeve portion at the right, the wafer 35 is made to tilt to compensate for the difference. When the wafer 35 is placed on the chuck and raised to meet the sleeve, the wafer edge at the left of the cross-sectional drawing engages the sleeve 41. The chuck body 12 tilts to compensate for the difference in the engaging pressure between the two regions. Thus, the chuck body and the wafer edge on the right tilts upward to engage the sleeve.

As shown in FIG. 6, the chuck body 12 and the wafer 35 are tilted in order to adjust to the tolerance variation between the two locations. The adjustment is performed automatically as the wafer 35 engages the sleeve 41. The self-adjustment allows for a fairly uniform gap separation of 0.001 in. around the circumference of the wafer where the wafer surface engages the sleeve 41. The wafer chuck 10 is made compliant to engaging the sleeve 41. Since it is self-adjusting, wafer processing repeatability is improved, allowing for repeated processing of wafers before manual adjustments are required.

Furthermore, since the central part of the chuck formed by the two disks 14, 15 does not tilt and the vacuum openings 30, along with the grooves 31, 32 retain the wafer 35 on to the chuck's surface, the wafer is centered and retained on the chuck, even when it is tilted. When the wafer is disengaged or if the tilt angle changes, the wafer will still maintain its central position.

Figure 7:
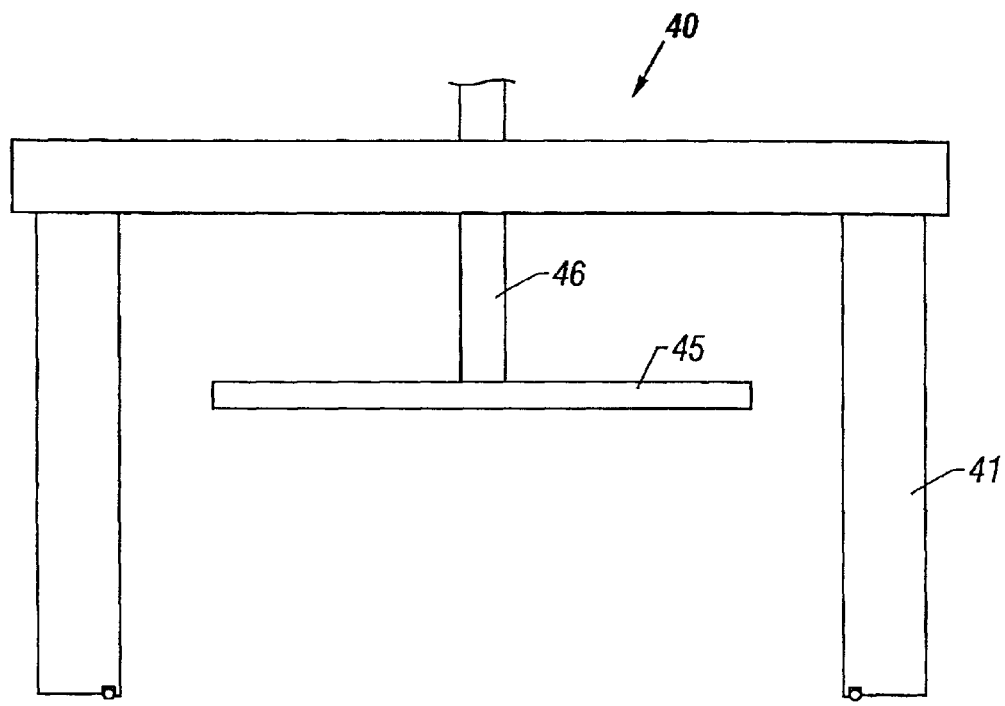
FIG. 7 is a cross-sectional view of the compliant chuck of FIG. 4 when it is lowered to a wafer unload position, in which a spider chuck is moved to the up position to lift the wafer off of the surface of the chuck.
Figure 7:
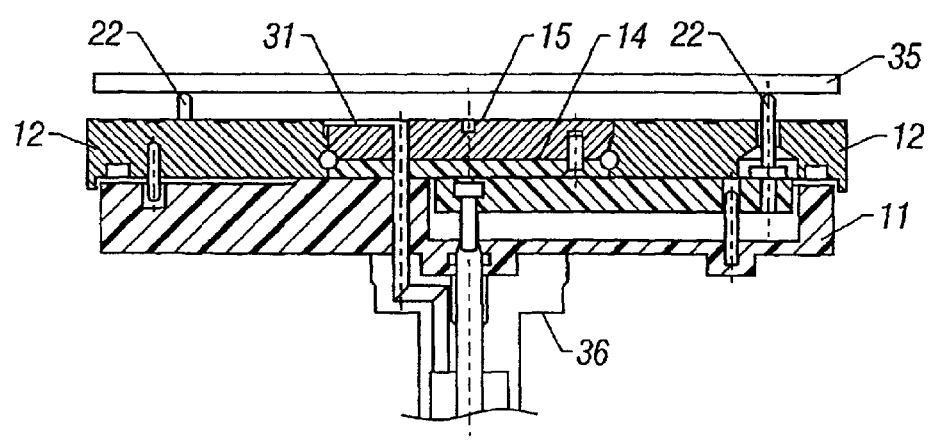

Once the processing is completed, the wafer needs to be unloaded from the chuck. Since wafers now tend to be 200 mm or larger, the preference is to slide a pick-up arm (or arms) underneath the wafer to lift the wafer off. The spider chuck 13 is engaged to perform this task. First the shaft is lowered to lower the chuck to an unloading position. The chuck may be rotated as part of a wash and rinse cycle. Then, compressed air or inert gas is forced through a passage 48 in the shaft 36 to exit at the center of the base 11 to push upward the spider chuck 13. As shown in FIG. 7, the spider chuck 13 rises to its up position to raise the lift pins 22 up through the openings 25. The lift pins 22 raise the wafer off of the chuck surface so that a wafer removing tool can be inserted under the wafer to remove it from the chuck 10.

Figure 8:
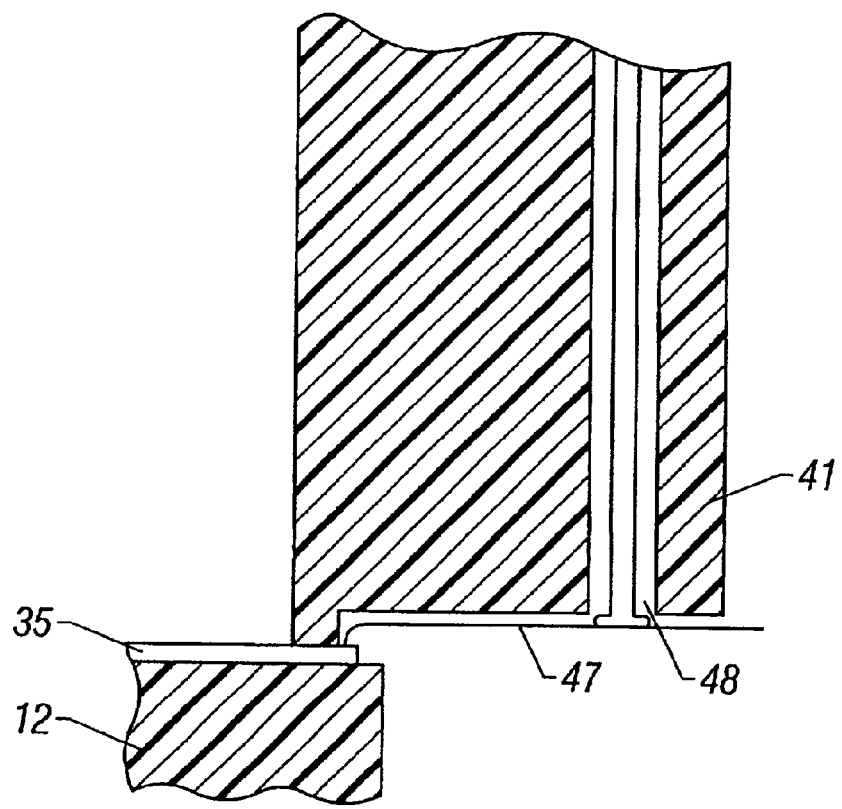
FIG. 8 is an enlarged cross-sectional view showing a portion of the wafer engaging a sleeve to form the containment vessel where an O-ring is not used.

A compliant wafer chuck of the present invention allows for a tight tolerance between the wafer and the sleeve, which tolerance can be in the order of 0.001 in. This tight tolerance can be maintained for a large diameter wafer. Thus, with the compliant go chuck, seal integrity can be maintained around the circumference of 200 mm, 300 mm or greater wafers. Because of the compliant nature of the chuck to self-adjust to tolerance differences, an O-ring at the bottom of the sleeve (as shown in FIG. 5) may not be necessary in some instances. Accordingly, as shown in FIG. 8, the sleeve 41 can be made to engage the wafer edge directly, without the need for an O-ring. In instances where the processing fluid may deteriorate the rubber O-rings rapidly, the approach illustrated in FIG. 8 may be desirable. However, if an O-ring is used, a much thinner O-ring can be used.

Figure 9:
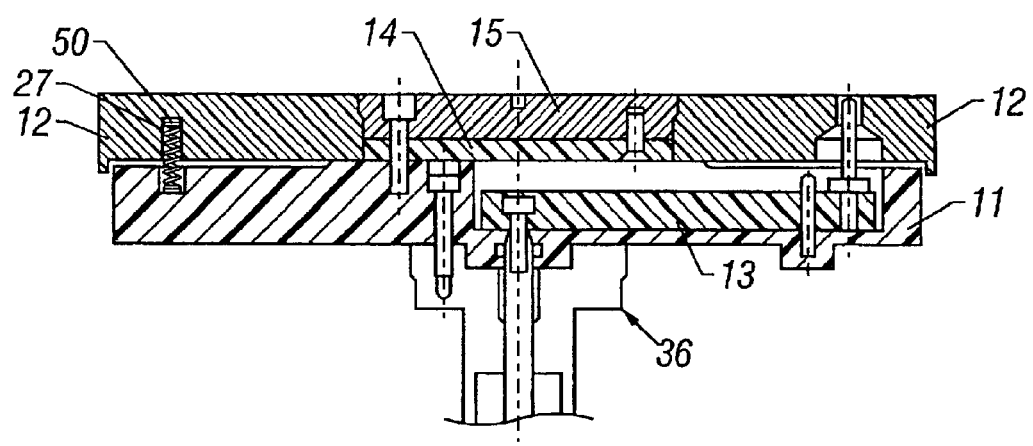
FIG. 9 is a cross-sectional view of an alternative embodiment in which springs are used instead of an elastomer to provide the flexible coupling.

It is also appreciated that the flexible coupling 16 could take other forms to allow the chuck body to tilt relative to the chuck base. Flexible material other than elastomers can be used. Furthermore, the coupling need not be limited to the location about the central disks. For example, as illustrated in FIG. 9, springs 50 can be positioned between the chuck base 11 and the chuck body 12. In the particular example, springs circumscribe the dowels 27 to allow flexible vertical movement of the chuck body 12, which allows for the chuck body 12 to tilt, causing the wafer rim to adjust to gap separation difference at the wafer edge where the wafer engages the sleeve. Other mechanisms can be readily adapted to provide equivalent operation to provide the compliant chuck of the present invention.

The components of the chuck 10 can be manufactured from a variety of materials. In the preferred embodiment, the chuck components, except for the lift pins 22 and the flexible coupling 16, are made from plastic materials. The sleeve is also made from plastic. It is appreciated that metals, ceramic, quartz, etc. can also be used. The lift pins are metallic and the O-ring or elastomer is made from rubber. The materials selected should be compatible with the processing fluid being utilized.

Thus, a compliant wafer chuck is described. Although the chuck is described in reference to a semiconductor wafer, the chuck can be readily used on other substrates as well, including substrates used for manufacturing flat panel displays.

I claim:

1. A method of processing a wafer comprising:
    placing a wafer atop a wafer chuck, the chuck having a base and an upper body in which the upper body is coupled to the base by a flexible coupling that allows the upper portion to tilt relative to the base;
    engaging the wafer to a hollow sleeve which forms an enclosing vessel to retain a processing fluid therein, the wafer forming a floor of the vessel; and
    preventing or reducing leakage of the processing fluid by tilting of the wafer to allow for a compliant engagement of the wafer and the sleeve.

2. The method of claim 1 further comprising raising at least one lift pin through the upper body to raise the wafer off of the upper body for removal of the wafer from the wafer chuck.

3. The method of claim 1 wherein processing the wafer includes using the processing used to deposit copper materials onto the wafer.

4. The method of claim 1 wherein processing the wafer includes using the processing fluid to remove copper materials from the wafer.

* * * * *